United States Patent
Noguchi (10) Patent No.: US 9,886,614 B2
(45) Date of Patent: Feb. 6, 2018

(54) WIRING BOARD FOR FINGERPRINT SENSOR

(71) Applicant: KYOCERA Corporation, Kyoto-shi, Kyoto (JP)

(72) Inventor: Sumiko Noguchi, Ayabe (JP)

(73) Assignee: KYOCERA CORPORATION, Kyoto-shi, Kyoto (JP)

( * ) Notice: Subject to any disclaimer, the term of this patent is extended or adjusted under 35 U.S.C. 154(b) by 20 days.

(21) Appl. No.: 15/271,413

(22) Filed: Sep. 21, 2016

(65) Prior Publication Data

US 2017/0091510 A1 Mar. 30, 2017

(30) Foreign Application Priority Data

Sep. 25, 2015 (JP) .................... 2015-188893

(51) Int. Cl.
| | |
|---|---|
| *H05K 1/09* | (2006.01) |
| *H05K 1/00* | (2006.01) |
| *H05K 1/11* | (2006.01) |
| *G06K 9/00* | (2006.01) |
| *H05K 1/02* | (2006.01) |

(52) U.S. Cl.
CPC ......... *G06K 9/0002* (2013.01); *H05K 1/0298* (2013.01); *H05K 1/115* (2013.01); *H05K 1/117* (2013.01); *H05K 2201/10151* (2013.01)

(58) Field of Classification Search
CPC ............... G06K 9/0002; H05K 1/0366; H05K 2201/017; H05K 2201/09236; H05K 2201/10151; H05K 1/162; H05K 3/4644; H05K 2201/029; H05K 1/0298; H05K 1/115; H05K 1/117

USPC ........................ 174/257, 258, 261
See application file for complete search history.

(56) References Cited

U.S. PATENT DOCUMENTS

| | | | |
|---|---|---|---|
| 6,462,563 B1 | 10/2002 | Kawahara et al. | |
| 2007/0111387 A1* | 5/2007 | Oi | H01L 21/4814 438/108 |
| 2012/0153463 A1* | 6/2012 | Maeda | H05K 1/115 257/737 |

(Continued)

FOREIGN PATENT DOCUMENTS

| | | | |
|---|---|---|---|
| JP | 2000-323205 A | 11/2000 | |
| JP | 2001-046359 A | 2/2001 | |

(Continued)

OTHER PUBLICATIONS

Korean Office Action with English concise explanation, Korean Patent Application No. 2016-0121369, dated Apr. 25, 2017, 6 pgs.

*Primary Examiner* — Sherman Ng
(74) *Attorney, Agent, or Firm* — Volpe and Koenig, P.C.

(57) ABSTRACT

A wiring board for a fingerprint sensor includes an insulating board including a plurality of laminated insulating layers, a plurality of fingerprint reading outer strip-shaped electrodes, a plurality of fingerprint reading inner strip-shaped electrodes, and a projection electrode formed on the inner strip-shaped electrode and projecting toward a space between the outer strip-shaped electrodes, in which a horizontal distance between the projection electrode and the outer strip-shaped electrode is 5 μm to 20 μm, and an upper surface of the projection electrode is covered with the uppermost insulating layer by a thickness of 1 μm to 10 μm.

3 Claims, 9 Drawing Sheets

(56) References Cited

U.S. PATENT DOCUMENTS

| | | | |
|---|---|---|---|
| 2014/0034367 A1* | 2/2014 | Lee | H05K 1/0373 174/255 |
| 2014/0182889 A1* | 7/2014 | Shin | H05K 3/4673 174/251 |
| 2015/0027758 A1* | 1/2015 | Maeda | H05K 3/421 174/255 |
| 2015/0101851 A1* | 4/2015 | Ko | H05K 1/0306 174/258 |
| 2015/0250050 A1 | 9/2015 | Lee et al. | |

FOREIGN PATENT DOCUMENTS

| | | |
|---|---|---|
| JP | 2012-094646 A | 5/2012 |
| KR | 10-2015-0102504 A | 9/2015 |

\* cited by examiner

WIRING BOARD FOR FINGERPRINT SENSOR

BACKGROUND OF THE INVENTION

1. Technical Field

The present disclosure relates to a wiring board for a fingerprint sensor.

2. Background

Figure 6:
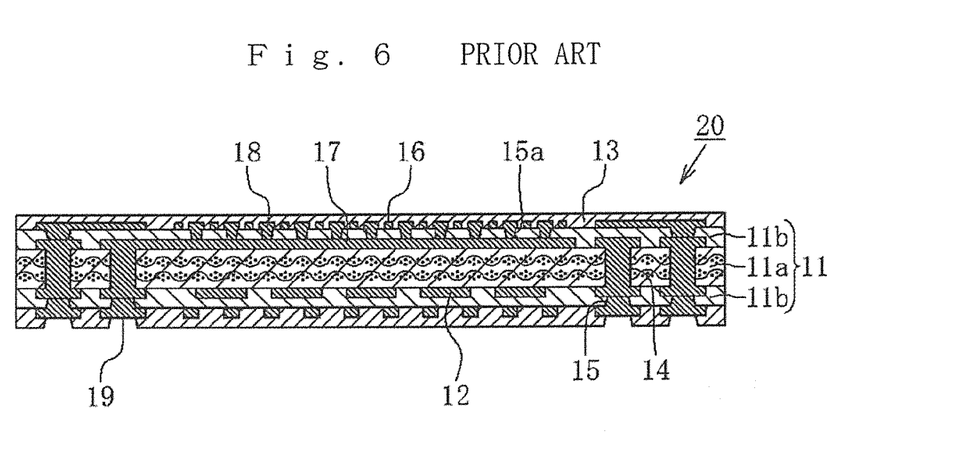
FIG. 6 is a schematic cross-sectional view illustrating a conventional wiring board for a fingerprint sensor.

FIG. 6 illustrates a conventional wiring board 20 for a fingerprint sensor. The conventional wiring board 20 for the fingerprint sensor includes an insulating board 11, a wiring conductor 12, and a solder resist layer 13. The conventional wiring board for a fingerprint sensor is disclosed in Japanese Unexamined Patent Publication No. 2001-46359, for example.

The insulating board 11 has a structure in which a buildup insulating layer 11b is laminated on each of upper and lower surfaces of a core insulating layer 11a. The core insulating layer 11a is made of thermosetting resin containing glass cloth. A thickness of the core insulating layer 11a is 30 μm to 400 μm. The core insulating layer 11a has a plurality of through-holes 14. The buildup insulating layer 11b is made of thermosetting resin not containing glass cloth. A thickness of the buildup insulating layer 11b is 10 μm to 20 μm. The buildup insulating layer 11b has a plurality of via-holes 15.

The wiring conductor 12 is adhered to the upper and lower surfaces of the core insulating layer 11a, an inner side of the through-hole 14, a surface of the buildup insulating layer 11b, and an inner side of the via-hole 15. The wiring conductor 12 is made of plated copper. A thickness of the wiring conductor 12 is 10 μm to 20 μm.

Figure 7:
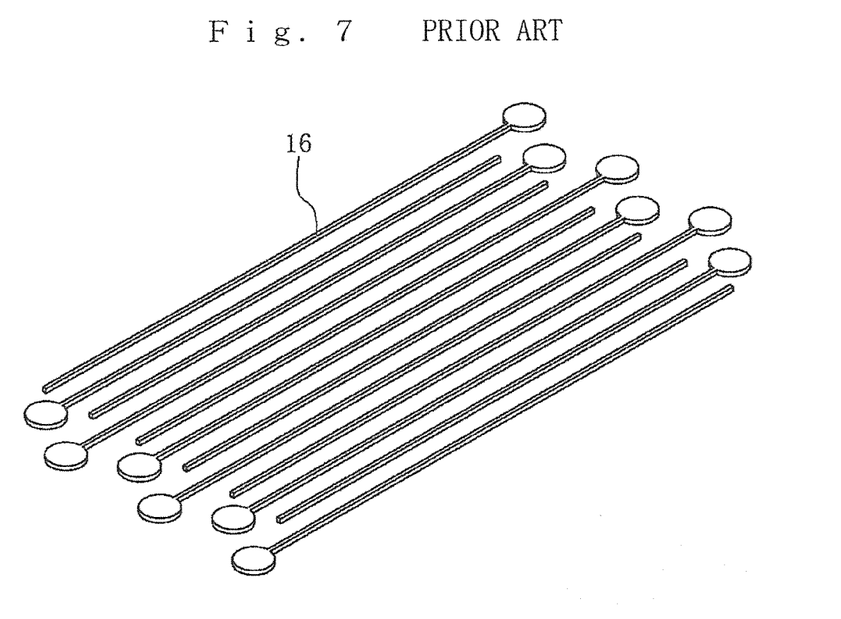
FIG. 7 is a schematic perspective view illustrating outer strip-shaped electrodes in the conventional wiring board for a fingerprint sensor.

The wiring conductor 12 formed on the uppermost layer partially serves as a fingerprint reading outer strip-shaped electrode for reading a fingerprint 16. As illustrated in FIG. 7, each of the outer strip-shaped electrodes 16 has a thin strip-shaped pattern with a land at its end, and they are arranged parallel to each other along a first direction. A width of a strip-shaped pattern portion of the outer strip-shaped electrode 16 is 5 μm to 20 μm. A distance between the adjacent strip-shaped pattern portions of the outer strip-shaped electrodes 16 is 50 μm to 65 μm.

Figure 8:
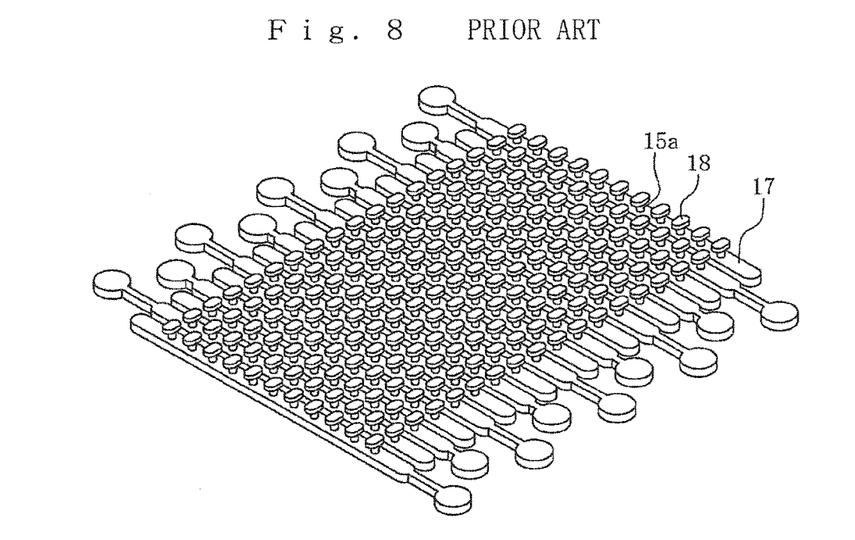
FIG. 8 is a schematic perspective view illustrating inner strip-shaped electrodes in the conventional wiring board for a fingerprint sensor.

The wiring conductor 12 positioned next to that on the uppermost layer across the upper buildup insulating layer 11b, that is, the wiring conductor 12 formed on the upper surface of the core insulating layer 11a partially serves as a fingerprint reading inner strip-shaped electrode for reading a fingerprint 17. As illustrated in FIG. 8, each of the inner strip-shaped electrodes 17 has a thin strip-shaped pattern with a land at its end, and they are arranged parallel to each other along a second direction perpendicular to the first direction. A width of the strip-shaped pattern portion of the inner strip-shaped electrode 17 is 30 μm to 65 μm. A distance between the adjacent strip-shaped pattern portions of the inner strip-shaped electrodes 17 is 15 μm to 40 μm.

Figure 9:
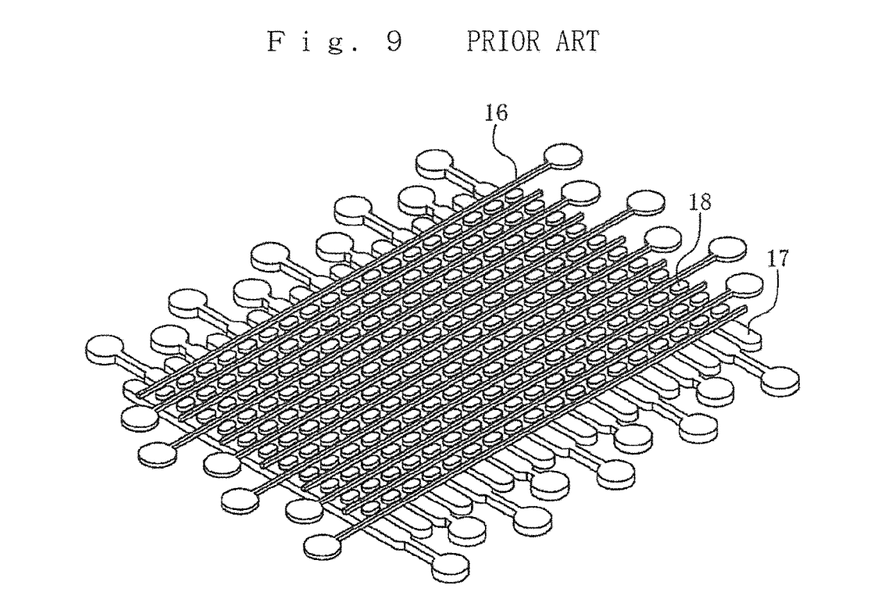
FIG. 9 is a schematic perspective view illustrating a state in which the outer strip-shaped electrodes and the inner strip-shaped electrodes vertically overlap with each other in the conventional wiring board for a fingerprint sensor.

Furthermore, a plurality of projection electrodes 18 are formed on an upper surface of the inner strip-shaped electrode 17 and each of the projection electrodes 18 projects toward a space between the outer strip-shaped electrodes 16. As illustrated in FIG. 9, a top portion of the projection electrode 18 is positioned between the outer strip-shaped electrodes 16. As for the top portion, a dimension along the first direction is 30 μm to 65 μm, a dimension along the second direction is 30 μm to 45 μm, and a distance to the outer strip-shaped electrode 16 is 10 μm to 20 μm. The top portion is connected to the inner strip-shaped electrode 17 through the via-hole 15a having a diameter of 20 μm to 40 μm. The outer strip-shaped electrodes 16 and the inner strip-shaped electrodes 17 vertically overlap and intersect with each other in perpendicular directions, as illustrated in FIG. 9.

The wiring conductor 12 formed on the lowermost layer partially serves as an external connection pad 19. The predetermined external connection pad 19, outer strip-shaped electrode 16, and inner strip-shaped electrode 17 are connected to each other through the wiring conductors 12.

The solder resist layer 13 is adhered to cover the upper and lower buildup insulating layers 11b and the wiring conductors 12 formed on their surfaces. The solder resist layer 13 is made of thermosetting resin. The solder resist layer 13 contains dispersed silica powder as a filler. A thickness of the solder resist layer 13 from the surface of the wiring conductor 12 is 5 μm to 20 μm. The upper solder resist layer 13 completely covers the wiring conductor 12. The lower solder resist layer 13 has an opening to expose the external connection pad 19.

When a finger is put on an upper surface of the wiring board 20 for the fingerprint sensor and a voltage is applied to the outer strip-shaped electrode 16, electrostatic capacitance is formed between a finger surface and the outer strip-shaped electrode 16 which are opposed across the upper solder resist layer 13. This electrostatic capacitance is high at a projected portion of the fingerprint, and low at a recessed portion of the fingerprint. Thus, a difference in the electrostatic capacitance is detected by sequentially scanning the plurality of outer strip-shaped electrodes 16 and the plurality of inner strip-shaped electrodes 17 while applying a voltage to them, and the fingerprint can be read by processing the detected difference with an external processor. According to the wiring board 20 for the fingerprint sensor, the projection electrode 18 projects and reaches the space between the outer strip-shaped electrodes 16. As a result, the electrostatic bond can be increased between the outer strip-shaped electrode 16 and the inner strip-shaped electrode 17, which improves fingerprint reading sensitivity.

Figure 10A:
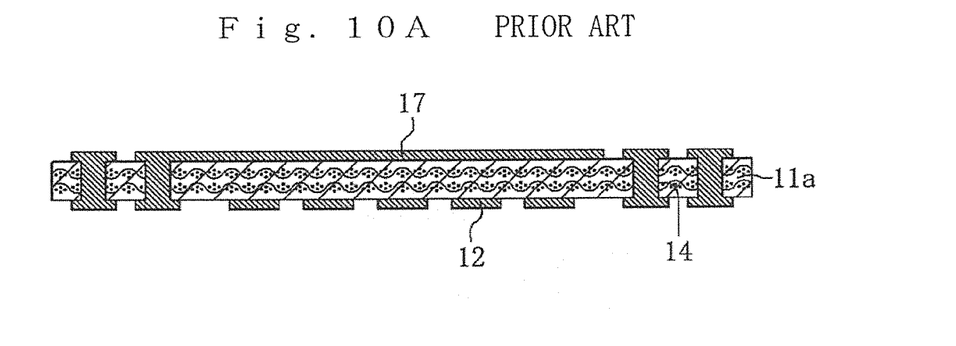
FIGS. 10A to 10F are schematic cross-sectional views to describe part of a method for manufacturing the conventional wiring board for a fingerprint sensor.

A description will be given to a method for forming the wiring conductor 12 including the outer strip-shaped electrode 16 and the projection electrode 18 in the wiring board 20 for the fingerprint sensor. As illustrated in FIG. 10A, the wiring conductor 12 including the inner strip-shaped electrode 17 is formed on the upper and lower surfaces of the core insulating layer 11a and the inner side of the through-hole 14. The wiring conductor 12 is formed by a known method such as a subtractive method or a semi-additive method.

Figure 10B:
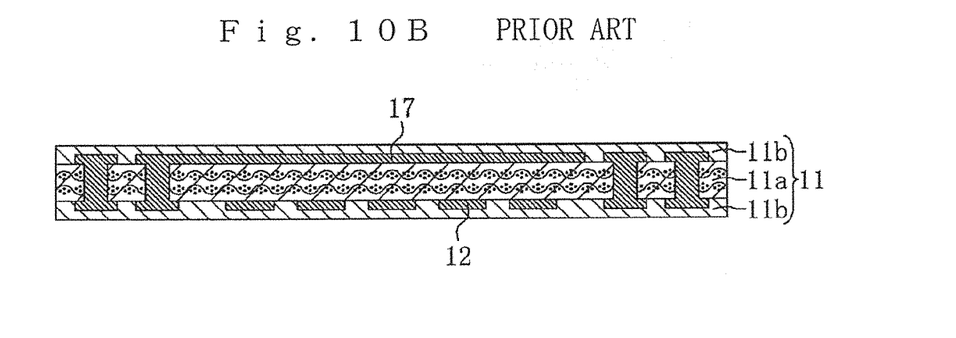
Figure 10C:
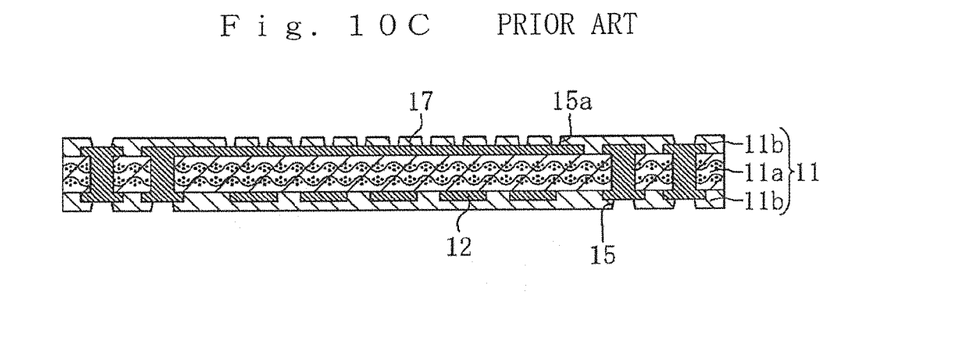

Next, as illustrated in FIG. 10B, the buildup insulating layer 11b is laminated on each of the upper and lower surface of the core insulating layer 11a having the wiring conductor 12. Then, as illustrated in FIG. 10C, the via-holes 15 including the via-hole 15a are formed in the buildup insulating layers 11b. The via-hole 15 is formed by laser processing. The via-hole 15a is formed above the inner strip-shaped electrode 17 and has a diameter of 20 μm to 40 μm. The via-hole 15 is formed above the wiring conductor 12 not serving as the inner strip-shaped electrode 17 and has a diameter of 50 μm to 70 μm.

Figure 10D:
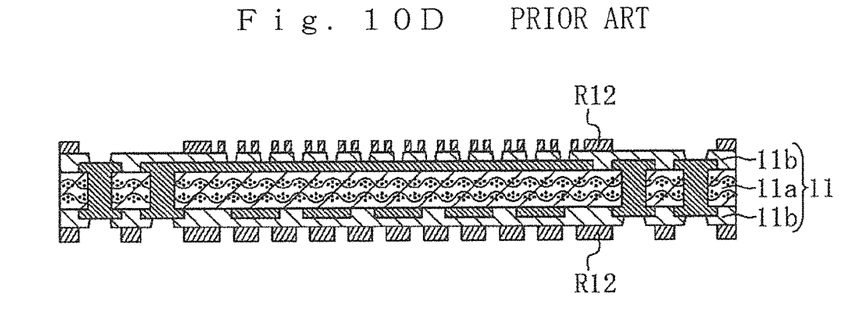

Next, a base metal layer (not illustrated) having a thickness of 0.1 μm to 1 μm is formed on the surface of the buildup insulating layer 11b and the inner surface of the via-hole 15 by a method such as an electroless plating method. Then, as illustrated in FIG. 10D, a plating resist layer R12 is formed on each surface of the upper and lower buildup insulating layers 11b. The plating resist layer R12 has an opening pattern corresponding to a wiring pattern of the wiring conductor 12 to be adhered to the surface of the buildup insulating layer 11b. The plating resist layer R12 is formed such that a photosensitive thermosetting resin film is attached to the surface of the buildup insulating layer 11b, exposed and developed to have the predetermined opening pattern, and then thermally cured.

Figure 10E:
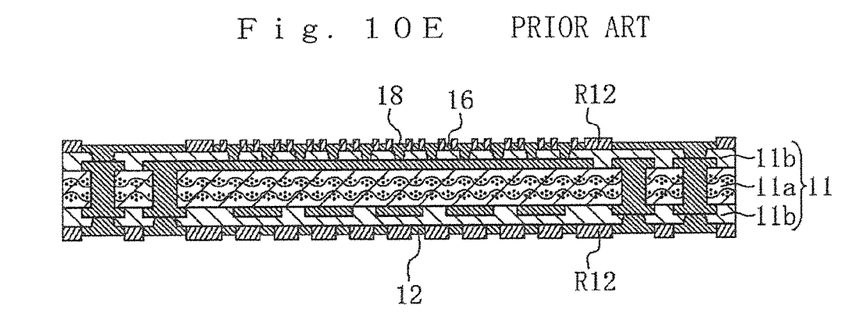
Figure 10F:
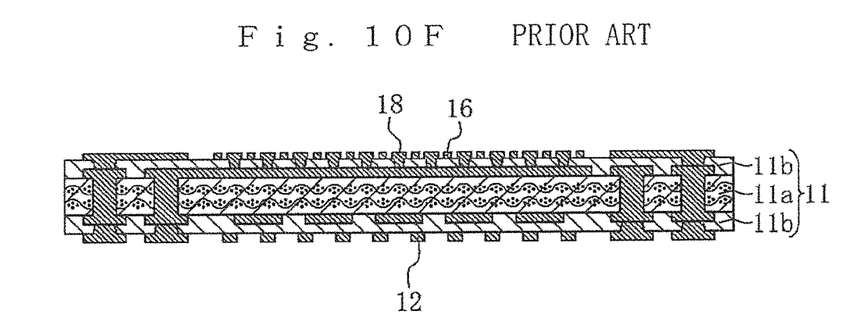

Next, as illustrated in FIG. 10E, to form the wiring conductor 12 including the outer strip-shaped electrode 16 and the projection electrode 18, an electrolytic copper plated layer is adhered to the base metal layer (not illustrated) exposed from the opening pattern of the plating resist layer R12. Next, as illustrated in FIG. 10F, the plating resist layer R12 is removed, and etching is performed to remove the base metal layer (not illustrated) exposed from the electrolytic copper plated layer serving as the wiring conductor 12, whereby the outer strip-shaped electrode 16 and the projection electrode 18 are formed as the wiring conductor 12.

However, according to the conventional wiring board 20 for the fingerprint sensor, as described above, the distance between the adjacent strip-shaped pattern portions of the outer strip-shaped electrodes 16 is 50 μm to 65 μm. In addition, the distance between the top portion of the projection electrode 18 and the strip-shaped pattern portion is 10 μm to 20 μm. Therefore, a thickness of a wall of the opening pattern provided in the plating resist layer R12 which is used to form the outer strip-shaped electrode 16 and the projection electrode 18 is extremely as small as 10 μm to 20 μm.

Thus, when the thickness of the wall of the opening pattern in the plating resist layer R12 is as small as 10 μm to 20 μm, the plating resist layer R12 is likely to be removed or lifted from the base metal layer at a region having the small thickness wall. When the plating resist layer R12 is removed or lifted, the electrolytic copper plated layer emerges at that region, and the electrolytic copper plated layer remains between the outer strip-shaped electrode 16 and the projection electrode 18. As a result, electric insulating reliability is reduced between the outer strip-shaped electrode 16 and the inner-strip-shaped electrode 17.

SUMMARY

A wiring board for a fingerprint sensor in the present disclosure includes an insulating board including a plurality of laminated insulating layers, a plurality of outer strip-shaped electrodes for reading a fingerprint formed on the uppermost insulating layer and arranged parallel to each other along a first direction, a plurality of fingerprint reading inner strip-shaped electrodes for reading a fingerprint formed on the insulating layer adjacent to the uppermost insulating layer and arranged parallel to each other along a second direction perpendicular to the first direction, and a projection electrode formed on each of the inner strip-shaped electrodes and projecting toward a space between the outer strip-shaped electrodes, in which a horizontal distance between the projection electrode and each of the outer strip-shaped electrodes is 5 μm to 20 μm, and an upper surface of the projection electrode is covered with the uppermost insulating layer by a thickness of 1 μm to 10 μm.

DETAILED DESCRIPTION

According to a wiring board for a fingerprint sensor in the present disclosure, as for a projection electrode, a horizontal distance to an outer strip-shaped electrode is 5 μm to 20 μm, and its upper surface is covered with an uppermost insulating layer by a thickness of 1 μm to 10 μm. Thus, a distance between the projection electrode and the outer strip-shaped electrode is small, and electrostatic capacitance to be formed between them can be high. As a result, the uppermost insulating layer covering the projection electrode can ensure high electric insulating property between the projection electrode and the outer strip-shaped electrode. Therefore, the present disclosure can provide the wiring board for a fingerprint sensor which realizes high sensitivity for reading the fingerprint, and high electric insulating reliability between the strip-shaped electrodes for reading the fingerprint.

Figure 1:
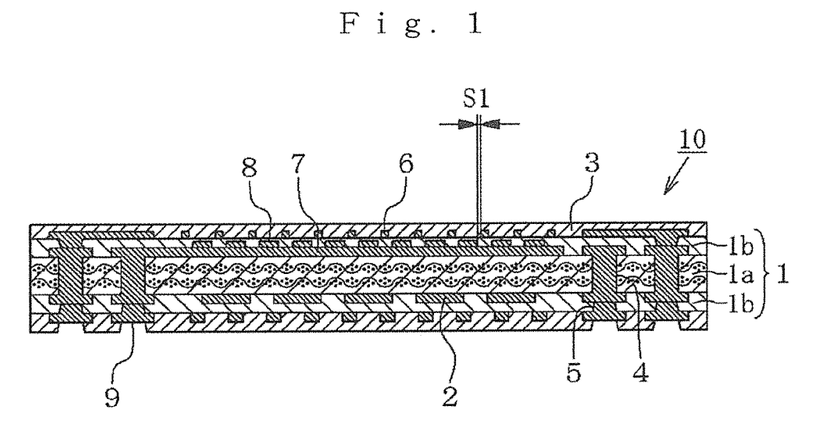
FIG. 1 is a schematic cross-sectional view illustrating a wiring board for a fingerprint sensor in one embodiment of the present disclosure.

Next, a wiring board for a fingerprint sensor in one embodiment of the present disclosure will be described with reference to FIGS. 1 to 4. As illustrated in FIG. 1, a wiring board 10 in the one embodiment includes an insulating board 1, a wiring conductor 2, and a solder resist layer 3.

The insulating board 1 has a structure in which a buildup insulating layer 1b is laminated on each of upper and lower surfaces of a core insulating layer 1a. The core insulating layer 1a contains a thermosetting resin containing glass cloth. The buildup insulating layer 1b contains a thermosetting resin not containing glass cloth. The thermosetting resins for the insulating layers include epoxy resin and bismaleimide triazine resin. The thermosetting resin may contain a dispersed inorganic insulator filler made of aluminum hydroxide or silica. A thickness of the core insulating layer 1a is 30 μm to 400 μm. The core insulating layer 1a has a plurality of through-holes 4. A diameter of the through-hole 4 is 70 μm to 100 μm. A thickness of the buildup insulating layer 1b is 10 µm to 20 µm. The buildup insulating layer 1b has a plurality of via-holes 5. A diameter of the via-hole 5 is 50 µm to 70 µm.

The wiring conductor 2 is adhered to the upper and lower surfaces of the core insulating layer 1a, an inner side of the through-hole 4, a surface of the buildup insulating layer 1b, and an inner side of the via-hole 5. The wiring conductor 2 is formed of plated copper. A thickness of the wiring conductor 2 is 10 µm to 20 µm on the upper and lower surfaces of the core insulating layer 1a, and is 5 µm to 50 µm on the surface of the buildup insulating layer 1b.

Figure 2:
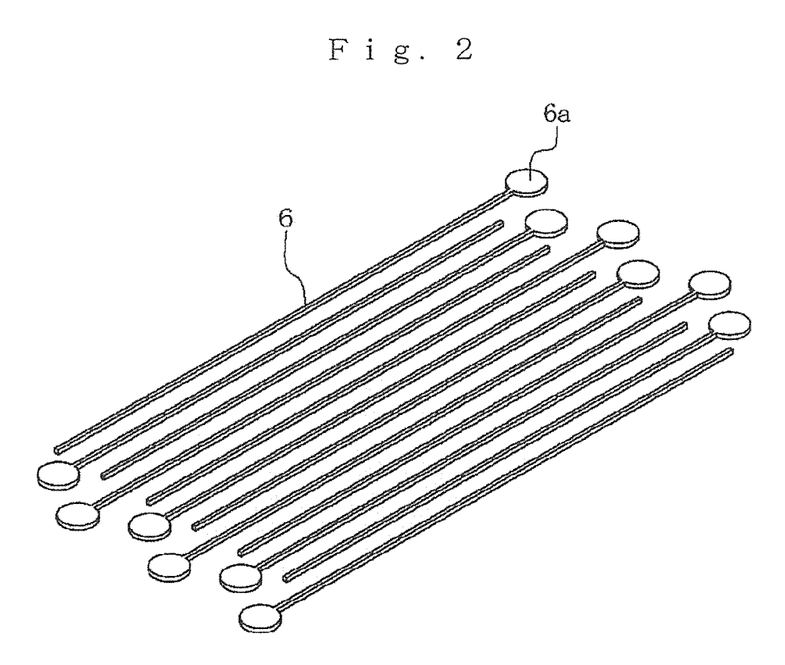
FIG. 2 is a schematic perspective view illustrating outer strip-shaped electrodes in the wiring board for a fingerprint sensor in the one embodiment of the present disclosure.

The wiring conductor 2 on the surface of the upper buildup insulating layer 1b partially serves as an outer strip-shaped electrode for reading a fingerprint 6. As illustrated in FIG. 2, each of the outer strip-shaped electrodes 6 has a thin strip-shaped pattern having a land 6a at its end, and they are arranged parallel to each other along a first direction. As for the outer strip-shaped electrode 6, a width of a strip-shaped pattern portion is 5 µm to 20 µm, and a distance between the adjacent strip-shaped pattern portions is 50 µm to 65 µm.

Figure 3:
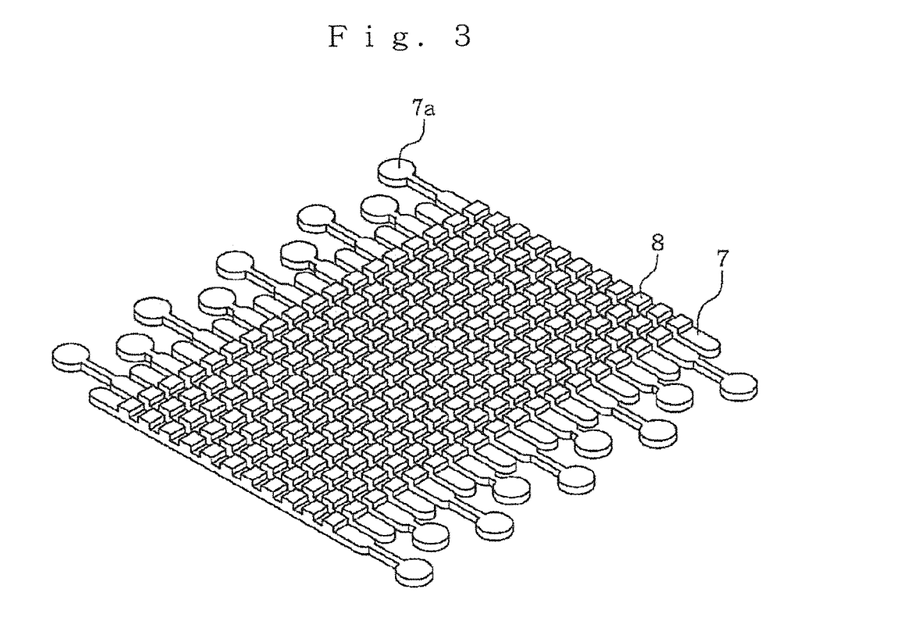
FIG. 3 is a schematic perspective view illustrating inner strip-shaped electrodes in the wiring board for a fingerprint sensor in the one embodiment of the present disclosure.

The wiring conductor 2 on the upper surface of the core insulating layer 1a partially serves as an inner strip-shaped electrode 7 for reading the fingerprint. As illustrated in FIG. 3, each of the inner strip-shaped electrodes 7 has a thin strip-shaped pattern having a plurality of projection electrodes 8 on its upper surface, and a land 7a at its end. The inner strip-shaped electrodes 7 are arranged parallel to each other along a second direction perpendicular to the first direction. As for the inner strip-shaped electrode 7, a width of the strip-shaped pattern portion is 30 µm to 65 µm, and a distance between the adjacent strip-shaped pattern portions is 15 µm to 40 µm.

The projection electrode 8 is formed at a position corresponding to a space between the outer strip-shaped electrodes 6. As for the projection electrode 8, a dimension along the first direction is 30 µm to 65 µm, a dimension along the second direction is 30 µm to 45 µm, and a height from the upper surface of the inner strip-shaped electrode 7 is 1 µm to 10 µm.

Figure 4:
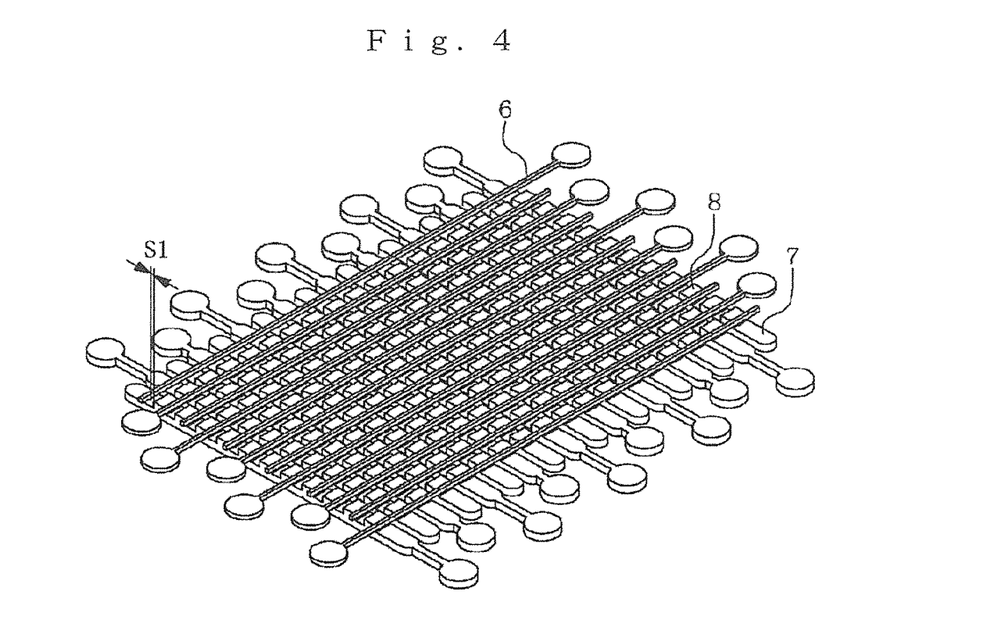
FIG. 4 is a schematic perspective view illustrating a state in which the outer strip-shaped electrodes and the inner strip-shaped electrodes vertically overlap with each other in the wiring board for a fingerprint sensor in the one embodiment of the present disclosure.

As illustrated in FIG. 4, the outer strip-shaped electrodes 6 and the inner strip-shaped electrodes 7 vertically overlap and intersect with each other in perpendicular directions. As for the projection electrode 8, a horizontal distance S1 to the outer strip-shaped electrode 6 is 5 µm to 20 µm, and its upper surface is lower than a lower surface of the outer strip-shaped electrode 6 by 1 µm to 10 µm. That is, the upper surface of the projection electrode 8 is covered with the buildup insulating layer 1b by a thickness of 1 µm to 10 µm in a state closely adjacent to the outer strip-shaped electrode 6.

The wiring conductor 2 on the surface of the lower buildup insulating layer 1b partially serves as an external connection pad 9. The external connection pad 9 has a circular shape having a diameter of 200 µm to 500 µm. The predetermined external connection pad 9, outer strip-shaped electrode 6, and inner strip-shaped electrode 7 are electrically connected through the wiring conductor 2.

Figure 5A:
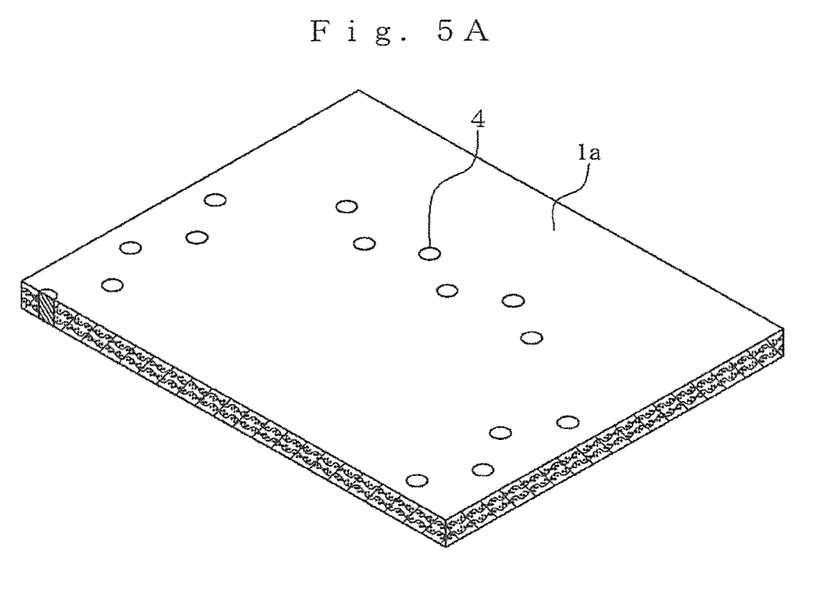
FIGS. 5A to 5F are schematic perspective views to describe part of a method for manufacturing the wiring board for a fingerprint sensor in the one embodiment of the present disclosure.

A method for forming the inner strip-shaped electrode 7 and the projection electrode 8 in the wiring board for a fingerprint sensor 10 will be described. First, as illustrated in FIG. 5A, the core insulating layer 1a having the through-holes 4 is prepared. The through-hole 4 is previously filled with plate copper. Abase metal layer (not illustrated) containing electroless plated copper and having a thickness of 0.1 µm to 1 µm is adhered to each of the upper and lower surfaces of the core insulating layer 1a.

Figure 5B:
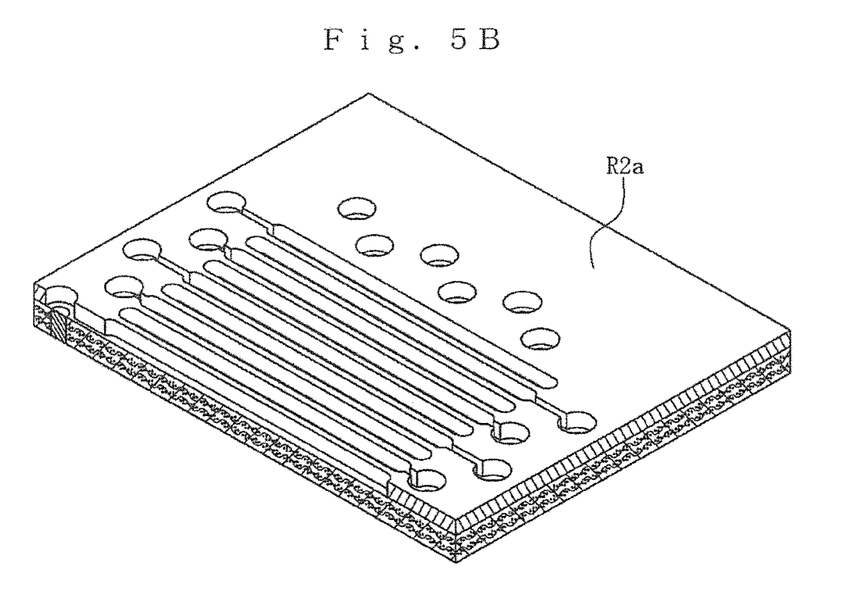

Next, as illustrated in FIG. 5B, a first plating resist layer R2a is formed on the upper surface of the core insulating layer 1a. The first plating resist layer R2a has a slit-shaped opening pattern corresponding to a wiring pattern of the inner strip-shaped electrode 7 to be adhered to the upper surface of the core insulating layer 1a. The first plating resist layer R2a is formed such that a photosensitive thermosetting resin film is attached to the surface of the core insulating layer 1a, exposed and developed to have the predetermined opening pattern, and then thermally cured. A plating resist layer is also formed on the lower surface of the core insulating layer 1a, but its description and illustration for the lower surface of the core insulating layer 1a are omitted to avoid duplication.

Figure 5C:
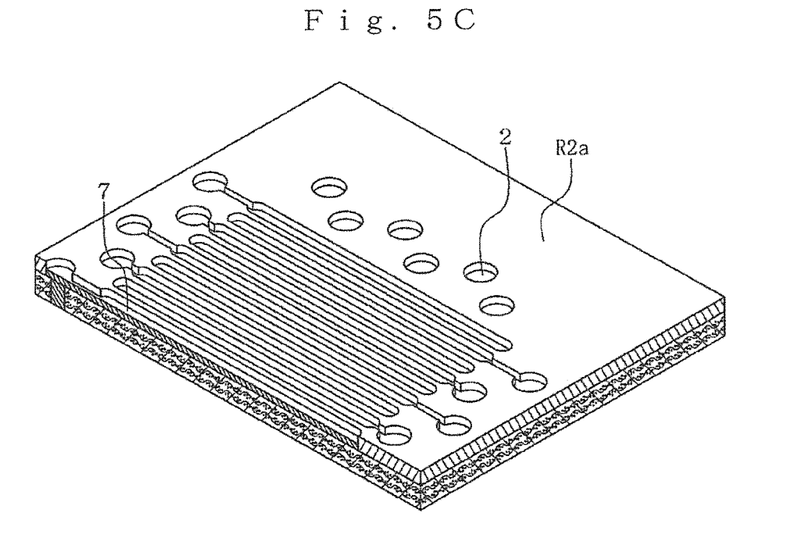
Figure 5D:
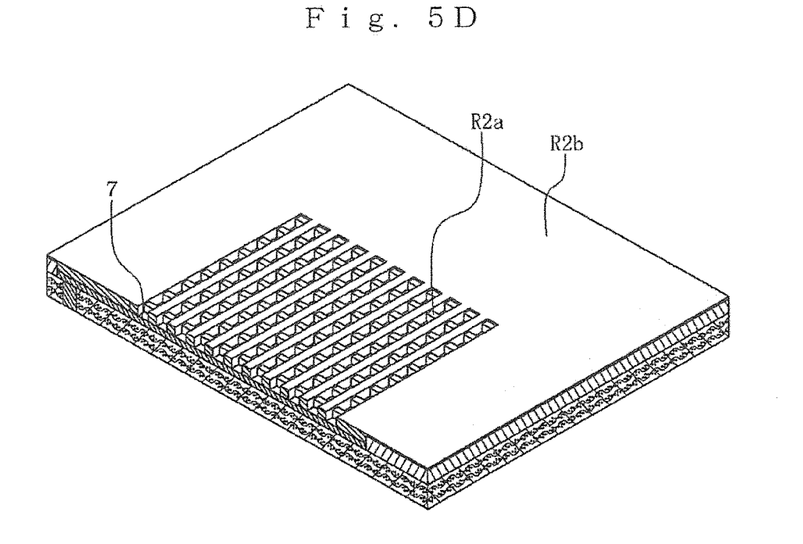

Next, as illustrated in FIG. 5C, the electrolytic copper plated layer is adhered to the base metal layer (not illustrated) exposed from the opening pattern of the first plating resist layer R2a to form the wiring conductor 2 including the inner strip-shaped electrode 7. Next, as illustrated in FIG. 5D, a second plating resist layer R2b is formed on the first plating resist layer R2a. The second plating resist layer R2b has a slit-shaped opening pattern having a width corresponding to the projection electrode 8. The slit-shaped opening pattern of the first plating resist layer R2a perpendicularly intersects with the slit-shape opening pattern of the second plating resist layer R2b. Material of the second plating resist layer R2b and a method for forming it are the same as those of the first plating resist layer R2a, so that the description for them is omitted here.

Figure 5E:
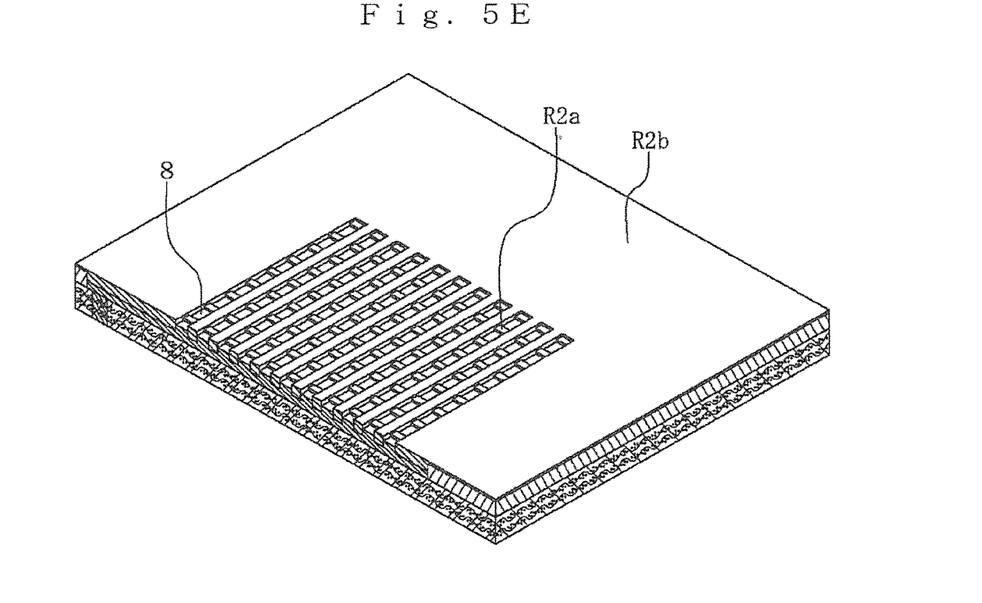
Figure 5F:
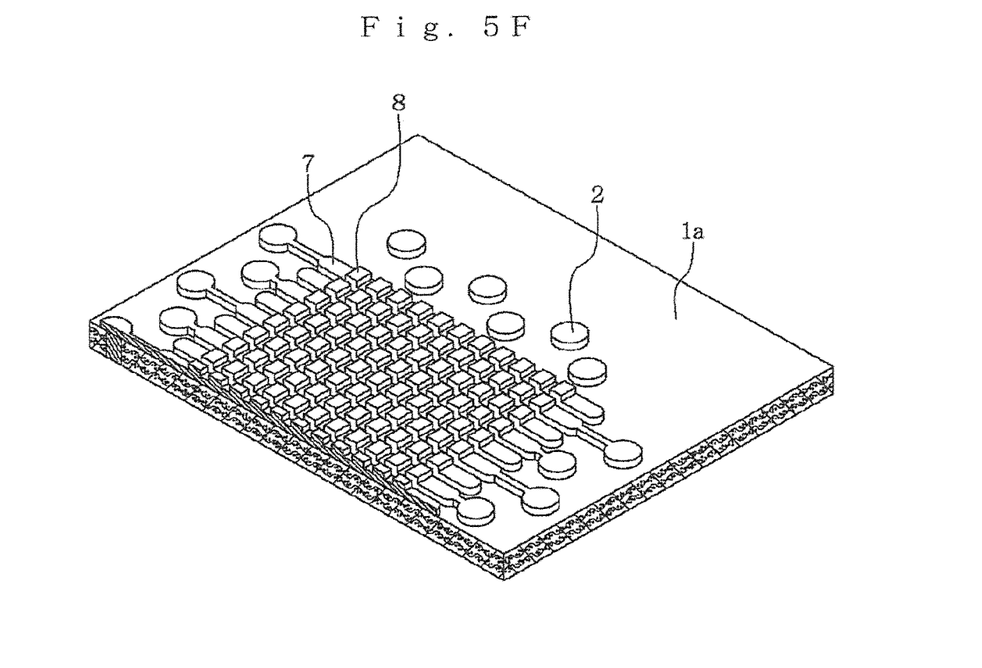

Next, as illustrated in FIG. 5E, to form the projection electrode 8, an electrolytic copper plated layer is adhered to the upper surface of the inner strip-shaped electrode 7 which is exposed at an intersection portion between the opening pattern of the first plating resist layer R2a and the opening pattern of the second plating resist layer R2b. Next, as illustrated in FIG. 5F, the first plating resist layer R2a and the second plating resist layer R2b are removed, and then etching is performed to remove the base metal layer (not illustrated) exposed from the electrolytic copper plated layer for the wiring conductor 2 including the inner strip-shaped electrode 7. In this way, the inner strip-shaped electrode 7 and the projection electrode 8 are formed as the wiring conductor 2.

The solder resist layer 3 is adhered to cover the upper and lower buildup insulating layers 1b and the wiring conductor 2 formed on the surfaces of the buildup insulating layers 1b. The solder resist layer 3 contains a thermosetting resin. The thermosetting resin includes acrylic modified epoxy resin. The upper solder resist layer 3 completely covers the wiring conductor 2 including the outer strip-shaped electrode 6. The lower solder resist layer 3 has an opening to expose the external connection pad 9.

When a finger is put on an upper surface of the wiring board 10 for the fingerprint sensor and a voltage is applied to the outer strip-shaped electrode 6, electrostatic capacitance is formed between a finger surface and the outer strip-shaped electrode 6 which are opposed across the upper solder resist layer 3. This electrostatic capacitance is high at a projected portion of the fingerprint, and low at a recessed portion of the fingerprint. Thus, a difference in the electrostatic capacitance is detected by sequentially scanning the plurality of outer strip-shaped electrodes 6 and the plurality of inner strip-shaped electrodes 7 while applying a voltage to them. Thus, the fingerprint can be read by processing the detected difference with an external processor.

As described above, according to the wiring board 10 for the fingerprint sensor, as for the projection electrode 8, the horizontal distance S1 to the outer strip-shaped electrode 6 is 5 μm to 20 μm, and its upper surface is covered with the buildup insulating layer 1b by the thickness of 1 μm to 10 μm. Therefore, a distance between the projection electrode 8 and the outer strip-shaped electrode 6 is small, and the electrostatic capacitance to be formed between them can be high. As a result, the buildup insulating layer 1b covering the projection electrode 8 can ensure high electric insulating property between the projection electrode 8 and the outer strip-shaped electrode 6. Thus, the present disclosure can provide the wiring board for a fingerprint sensor which realizes high sensitivity for reading the fingerprint, and high electric insulating reliability between the strip-shaped electrodes for reading the fingerprint.

When the horizontal distance S1 between the projection electrode 8 and the outer strip-shaped electrode 6 is less than 5 μm, the electric insulating reliability is highly likely to be lowered between the projection electrode 8 and the outer strip-shaped electrode 6 even though the upper surface of the projection electrode 8 is covered with the buildup insulating layer 1b by the thickness of 1 μm to 10 μm. On the other hand, when the horizontal distance S1 between the projection electrode 8 and the outer strip-shaped electrode 6 exceeds 20 μm, electrostatic bond between the projection electrode 8 and the outer strip-shaped electrode 6 is reduced, so that it is difficult to ensure the high sensitivity for reading the fingerprint.

When the thickness of the buildup insulating layer 1b provided on the upper surface of the projection electrode 8 is less than 1 μm, the electric insulating reliability is likely to be lowered between the projection electrode 8 and the outer strip-shaped electrode 6. On the other hand, the thickness of the buildup insulating layer 1b provided on the upper surface of the projection electrode 8 exceeds 10 μm, electrostatic bond between the projection electrode 8 and the outer strip-shaped electrode 6 is reduced, so that it is difficult to ensure the high sensitivity for reading the fingerprint.

The wiring board for a fingerprint sensor in the present disclosure is not limited to the one in the above embodiment, and various modifications can be allowed without departing from the scope of the present disclosure. For instance, as illustrated in FIG. 1, the wiring board 10 for the fingerprint sensor in the above embodiment has the structure in which the one buildup insulating layer 1b is laminated on each of the upper and lower surfaces of the core insulating layer 1a. However, the two or more buildup insulating layers may be laminated on each layer, and the number of buildup insulating layers may be different between the upper and lower surfaces of the core insulating layer.

What is claimed is:

1. A wiring board for a fingerprint sensor comprising:
an insulating board including a plurality of laminated insulating layers;
a plurality of fingerprint reading outer strip-shaped electrodes formed on the uppermost insulating layer and arranged parallel to each other along a first direction;
a plurality of fingerprint reading inner strip-shaped electrodes formed on the insulating layer adjacent to the uppermost insulating layer and arranged parallel to each other along a second direction perpendicular to the first direction; and
a projection electrode formed on each of the outer strip-shaped electrodes and projecting toward a space between the outer strip-shaped electrodes, wherein
a horizontal distance between the projection electrode and each of the outer strip-shaped electrodes is 5 μm to 20 μm, and an upper surface of the projection electrode is covered with the uppermost insulating layer by a thickness of 1 μm to 10 μm.

2. The wiring board according to claim 1, wherein the insulating board includes a core insulating layer and at least one buildup insulating layer laminated on each of upper and lower surfaces of the core insulating layer.

3. The wiring board according to claim 1, wherein the insulating board includes a core insulating layer and one buildup insulating layer laminated on each of upper and lower surfaces of the core insulating layer, a plurality of outer strip-shaped electrodes are formed on the buildup insulating layer laminated on the upper surface of the core insulating layer, and a plurality of the inner strip-shaped electrodes are formed on the upper surface of the core insulating layer.

* * * * *